(12) United States Patent
Foong et al.

(10) Patent No.: US 7,932,131 B2
(45) Date of Patent: Apr. 26, 2011

(54) REDUCTION OF PACKAGE HEIGHT IN A STACKED DIE CONFIGURATION

(75) Inventors: Sally Foong, Milpitas, CA (US); Kevin Guan, Richmond, CA (US); Changhak Lee, Cupertino, CA (US); Lai Nguk Chin, Penang (MY); Royce Yeoh Kao Tziat, Penang (MY); Foong Yue Ho, Penang (MY)

(73) Assignee: Spansion LLC, Sunnyvale, CA (US)

( * ) Notice: Subject to any disclaimer, the term of this patent is extended or adjusted under 35 U.S.C. 154(b) by 591 days.

(21) Appl. No.: 11/983,041

(22) Filed: Nov. 5, 2007

(65) Prior Publication Data
US 2009/0115033 A1 May 7, 2009

(51) Int. Cl.
*H01L 21/00* (2006.01)
*H01L 23/02* (2006.01)
*H01L 23/52* (2006.01)

(52) U.S. Cl. ........ 438/118; 438/125; 287/686; 287/777; 287/784

(58) Field of Classification Search ........................ None
See application file for complete search history.

(56) References Cited

U.S. PATENT DOCUMENTS

| | | | | |
|---|---|---|---|---|
| 5,310,702 A | * | 5/1994 | Yoshida et al. | 438/123 |
| 5,804,004 A | * | 9/1998 | Tuckerman et al. | 156/60 |
| 5,950,100 A | * | 9/1999 | Shingai | 438/617 |
| 6,177,726 B1 | * | 1/2001 | Manteghi | 257/725 |
| 6,258,632 B1 | * | 7/2001 | Takebe | 438/127 |
| 6,894,398 B2 | * | 5/2005 | Pon | 257/786 |
| 7,202,109 B1 | * | 4/2007 | Zakharian et al. | 438/118 |
| 7,215,008 B2 | * | 5/2007 | Kim et al. | 257/666 |
| 7,215,031 B2 | * | 5/2007 | Egawa | 257/773 |
| 7,374,969 B2 | * | 5/2008 | Cho et al. | 438/112 |
| 2006/0097374 A1 | * | 5/2006 | Egawa | 257/686 |
| 2006/0097404 A1 | * | 5/2006 | Cho et al. | 257/782 |
| 2008/0131999 A1 | * | 6/2008 | Takiar et al. | 438/109 |

* cited by examiner

*Primary Examiner* — Scott B Geyer

(57) ABSTRACT

A method and structure for reducing the size of semiconductor package is disclosed. In one example embodiment, a method for stacking dies of a semiconductor package includes forming a set of insulated bonding wires between respective bonding pads of a first semiconductor integrated circuit die and a conductive layer electrically detached from the respective bonding pads, applying an adhesive material on a top surface of the first semiconductor integrated circuit die, and securing a second semiconductor integrated circuit die one the top surface of the first semiconductor integrated circuit die with the adhesive material.

17 Claims, 9 Drawing Sheets

REDUCTION OF PACKAGE HEIGHT IN A STACKED DIE CONFIGURATION

FIELD OF TECHNOLOGY

This disclosure relates generally to technical fields of semiconductor manufacturing, in one embodiment, to a method and structure of reducing the size of semiconductor package.

BACKGROUND

Packaging refers to a set of technologies that connect integrated circuits (ICs) with electronic systems. The packaging may include on-chip interconnections and chip-to-printed circuit board interconnections. One form of the packaging may involve three basic processes: die attach, wire bond, and encapsulation.

The die attach process provides mechanical adhesion of a chip to its intended substrate (e.g., a printed circuit board, interconnecting substrate, etc.). The chip may be picked up (e.g., by a machine) from a wafer sawed off in an earlier process. The bottom surface of the chip is often laminated with an adhesive film formed at the wafer level. The chip is then placed precisely to an intended location and the adhesive film is cured (e.g., baked) to complete the die attach process.

Next, the chip is attached to a printed circuit board or another electronic system in the wire bond process. The wire bond process requires connecting bond wires between bonding pads of the chip to contact points on the printed circuit board. During the process, a wire bond machine welds the bond wires between the bonding pads and the contact points by using the technique of ultrasonic, thermosonic, or thermocompression bonding. In the encapsulation process, the die (e.g., and/or the bonding wires and/or the contact points) is enclosed is an encapsulant to protect itself from mechanical damage during handling and additional processing.

A stacked die configuration, whereby multiple dies are placed on top of another, may be used to develop more powerful components while decreasing the size (e.g., the width, length, and/or height) of the components (e.g., or a package enclosing the components). A number of methods are currently used to reduce the height of the package. A silicon spacer, a film spacer, a spacer paste, and/or a film on wire layer (FOW) are currently used in the application of a stacked die or multi die packing process.

FIG. 1 is a cross sectional view of a die spacer 114 formed between a first die 104 and a second die 118. As illustrated in FIG. 1, a bottom surface of the first die 104 (e.g., with one or more integrated circuits) is laminated with an adhesive film 106 before the first die 104 is sawed off from the wafer. As explained earlier in the die attach process, the first die 104 is picked up and placed above a mounting base 102 (e.g., a die attach pad of a leadframe, a first conductive area of the interconnecting substrate, etc.).

Then, a wire bonding machine (e.g., a capillary wire bonding machine) may be used to connect bonding wires (e.g., a bonding wire 112A, a bonding wire 112B, etc.) between bonding pads (e.g., a bonding pad 108A, a bonding pad 108B, etc.) and contact points (e.g., a bonding finger 110A, a bonding finger 110B, etc.) located on leads of the leadframe or a second conductive area of the interconnecting substrate electrically detached from the first conductive area. The bonding wires being used are often exposed to other components and/or environments without any protection.

Next, the die spacer 114 (e.g., a silicon spacer) is attached above the first die 104. As shown in FIG. 1, the die spacer 114 is designed to leave an extra room above the peak of the bonding wires such that the second die 118 does not touch, short, or damage the bonding wires below. The die spacer 114 also comes with an adhesive film 116 to secure itself above the first die 104. Then, the second die 118 is adhered on top of the die spacer 114 using an adhesive film 120.

Because the die spacer 114 has to clear the bonding wires, the height of the die spacer 114 (e.g., which may range from between 50 and 100 micrometers) plus the height of the adhesive film 116 (e.g., which is its height ranging from 10 to 50 micrometers) of the second die 118 have to added to the total height of the package. The added heights could significantly add to the size of the package when the package has a large number of stacked dies (e.g., where the number is often three to five but may be as much as ten or more). Furthermore, an extra labor and/or time may be required to form and/or implement the die spacer 114, thus decreasing the throughput and/or increasing the production cost of the packaging process.

FIG. 2 is a cross sectional view of a film on wire layer 214 formed between a first die 204 and a second die 216. The film on wire layer 214 is used in place of the die spacer 114 to separate the second die 216 from the bonding wires below (e.g., 212A, 212B, etc.). Although the film on wire layer 214 eliminates the adhesive film which would have been laminated at the bottom surface of the second die 216, the film on wire layer 214 has to be formed in such a height to clear the bonding wires (e.g., a bonding wire 212A, a bonding wire 212B, etc.) which are not protected. As in FIG. 1, the extra height required in the film on wire layer 214 (FOW) may add to the total height of the package. In addition, the extra time, labor and cost to apply the amount of the film on wire layer 214 may make the packing process inefficient and/or unproductive.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a method for reducing a distance between stacked dies of a semiconductor package by applying an adhesive material between adjacent ones of the stacked dies (e.g., which include bonding pads connected to insulated bonding wires) and curing the stacked dies.

As illustrated in the detailed description, other embodiments pertain to methods and structures that provide an improved packaging process of the semiconductor package, and in particular, a reduction of the total height of the semiconductor package. By using an insulated bonding wire and adhesive material, the embodiments provide semiconductor packages with a reduced package height.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments reduce the height of semiconductor package by getting rid of die spacers being used to accommodate bonding wires. It is a common practice to place adjacent dies of the semiconductor package far enough by using a die spacer so that there is no shortage formed between bonding wires of the lower die and the die above them. However, the addition of the die spacer may substantially add to the height of the semiconductor package. Instead of the die spacer, the embodiments include applying an adhesive material between the adjacent dies to secure them closer together. This is made possible by coating the bonding wires with an insulating material so that there is no shortage formed in the semiconductor package due to the upper die touching the bonding wires of the lower die.

Figure 3:
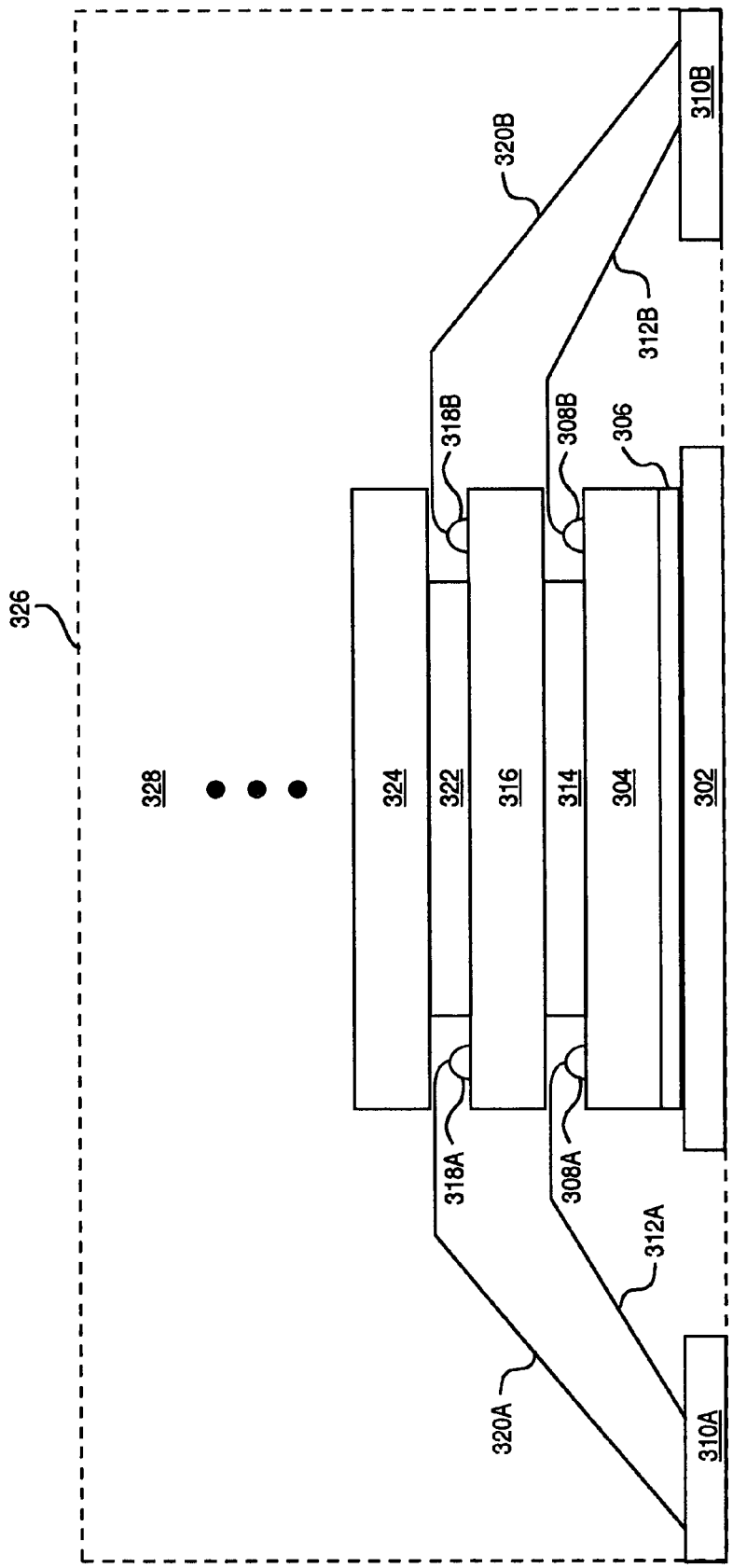
FIG. 3 is a cross sectional view of multiple dies of a semiconductor package closely secured to reduce a total height of the semiconductor package by using an adhesive material and insulated bonding wires, according to one embodiment.

FIG. 3 is a cross sectional view of multiple dies of a semiconductor package 326 closely secured to reduce a total height of the semiconductor package 326 by using an adhesive material and insulated bonding wires, according to one embodiment. As illustrated in FIG. 3, multiple dies are mounted on a mounting base 302 (e.g., which may be one of a leadframe, a grid array substrate, a printed circuit board, a printed wiring board, an interconnecting substrate, etc.). A first die 304 (e.g., with an adhesive film 306 laminated on the bottom surface) is placed and/or attached to the mounting base 302 (e.g., by using a machine). Each of the multiple dies may be one or more integrated circuits that form a memory (e.g., a random access memory, a read only memory, an erasable programmable read only memory, an electrically erasable programmable read only memory, a flash memory, etc.) or other electronic components.

Figure 4A:
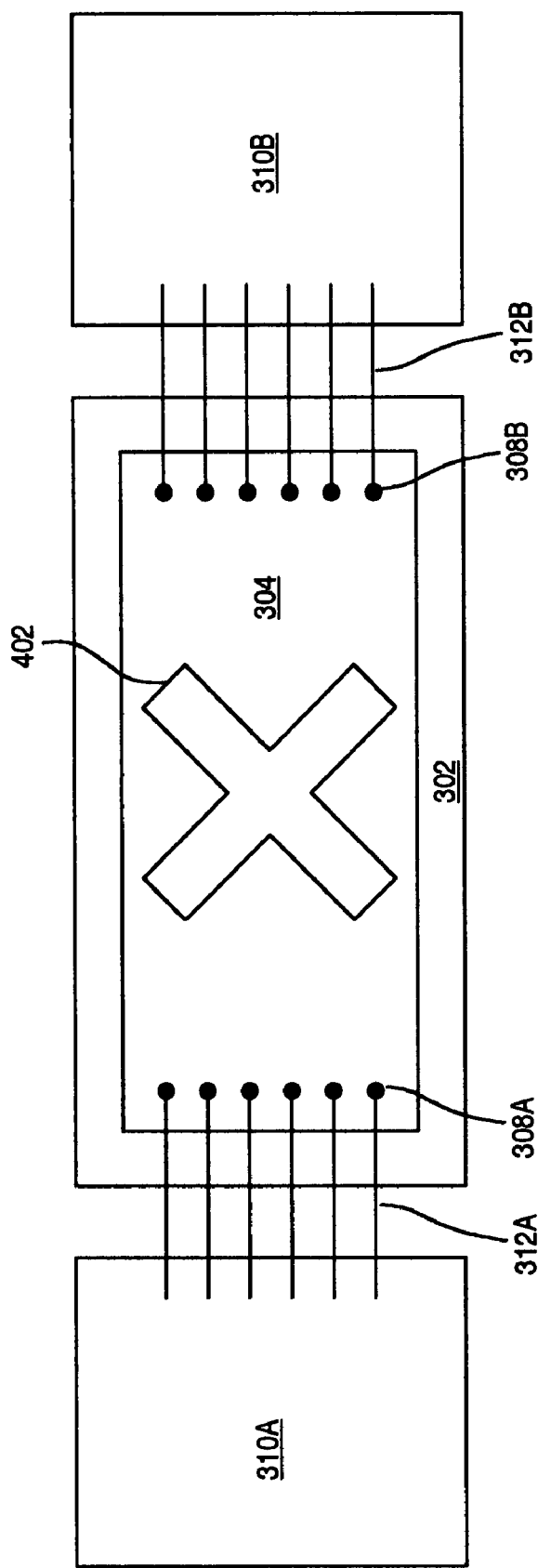
FIG. 4A is a horizontal cross sectional view of an epoxy paste applied on the top surface of the first die of FIG. 3, according to one embodiment.

An adhesive material 314 is then applied on the top surface of the first die 304 (e.g., as will be illustrated in more details in FIG. 4A). Then, bonding wires (e.g., a bonding wire 312A, a bonding wire 312B, etc.) are welded to bonding pads (e.g., a bonding pad 308A, a bonding pad 308B, etc.) and/or contact points (e.g., a bonding finger 310A, a bonding finger 310B, etc.) of the first die 304 by using a wire bonding technique. The bonding fingers (e.g., the bonding finger 310A, the bonding finger 310B, etc.) may be parts of leads of the leadframe or a conductive trace of one of the substrates (e.g., the grid array substrate, the interconnecting substrate, etc.).

The wirebonding technique is an electrical interconnection technique using thin wire and a combination of heat, pressure and/or ultrasonic energy. Wirebonding is a solid phase welding process, where the two metallic materials (e.g., a wire, a bonding pad, a bonding finger, and/or other conductive layer) are brought into intimate contact. The bonding wires (e.g., in copper, aluminum, gold, and/or other metal) may be welded using a special bonding tool (e.g., a capillary or a wedge). Depending on bonding agent (e.g., heat and ultrasonic energy), the bonding process can be defined to three major processes: thermocompression bonding (T/C), ultrasonic bonding (U/S), and thermosonic bonding (T/S). Wirebonding may be effective when dealing with relatively small I/O counts (e.g., less than 500 I/O).

In one example embodiment, the bonding wires (e.g., the bonding wire 312A, the bonding wire 312B, a bonding wire 320A, a bonding wire 320B, etc.) being used for wirebonding may come as insulated. In another example embodiment, the bonding wires may be treated with an insulation material in situ as will be illustrated more in details in FIGS. 5A and 5B.

Then, a second die 316 is secured to the adhesive material 314. In one example embodiment, the bottom surface of the second die 316 may just clear the bonding wires (e.g., the bonding wire 312A, the bonding wire 312B, etc.). In another example embodiment, the bottom surface of the second die 316 may touch the bonding wires (e.g., the bonding wire 312A, the bonding wire 312B, etc.). In this embodiment, the bonding wires may be used to support the second die 316 when another set of bonding wires (e.g., a bonding wire 320A, a bonding wire 320B, etc.) are being welded to bonding pads (e.g., a bonding pad 318A, a bonding pad 318B, etc.) of the second die 316 by using a capillary wirebonding machine (e.g., as will be illustrated in more details in FIG. 6).

Figure 1:
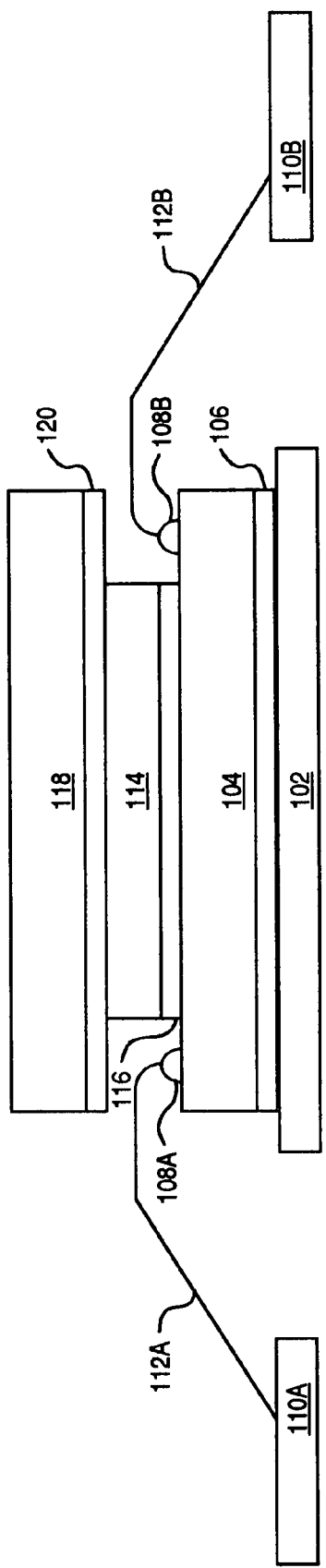
FIG. 1 is a cross sectional view of a die spacer formed between a first die and a second die.
Figure 2:
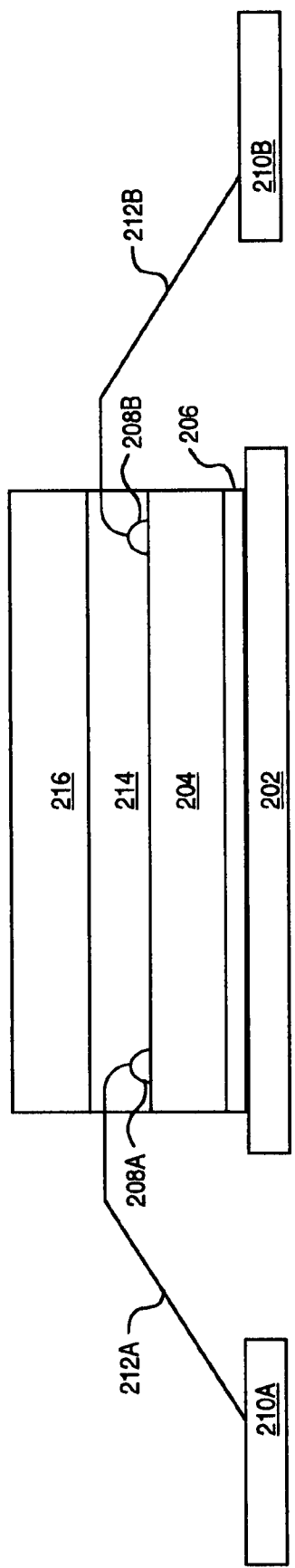
FIG. 2 is a cross sectional view of a film on wire layer formed between a first die and a second die.

In either case, it may not be necessary to leave a room between the bottom surface of the second die 316 and the bonding wires of the first die 304 because the possibility of electrical shortage is eliminated by coating the bonding wires with an insulating material. More dies may be closely secured by applying the adhesive material and/or wirebonding using insulated bonding wires (e.g., where the gap between adjacent dies may be significantly reduced when compared to prior arts illustrated in FIGS. 1 and 2). In one example embodiment, the gap between the adjacent dies may be 50 micrometers.

It may be possible to stack two to fifteen dies by using this method (e.g., although the optimum number of dies may be between three and five). Furthermore, a finer pitch wirebonding technique may be possible because there is no danger of touching adjacent bonding wires as they are insulated.

Once the wirebonding and securing of the multiple dies are completed, the semiconductor package 326 may be formed by a molding process. In the molding process, an encapsulant (e.g., a package body made of plastic or other material) may enclose the multiple dies, the bonding pads, the bonding wires, and the bonding fingers to protect them.

In one example embodiment, a semiconductor package includes one or more stacked semiconductor integrated circuit dies closely attached by an adhesive material, multiple sets of bonding wires (e.g., which are coated with an insulating material) connecting respective bonding pads of the one or more stacked semiconductor integrated circuit dies to respective bonding fingers, and an encapsulant enclosing the one or more stacked semiconductor integrated circuit dies, the multiple sets of bonding wires, the respective bonding pads, and the respective bonding fingers.

FIG. 4A is a horizontal cross sectional view of an epoxy paste 402 applied on the top surface of the first die 304 of FIG. 3, according to one embodiment. In FIG. 4A, the epoxy paste 402 may be applied (e.g., painted, brushed, stroked, stamped, screen printed, programmable pattern dispensed, etc.) on the top surface of the first die 304. The epoxy paste 402 may be applied in an X pattern, a Y pattern, a star pattern, or any other pattern befitting the purpose (e.g., of attaching the first die 304 and the second die 316).

Figure 4B:
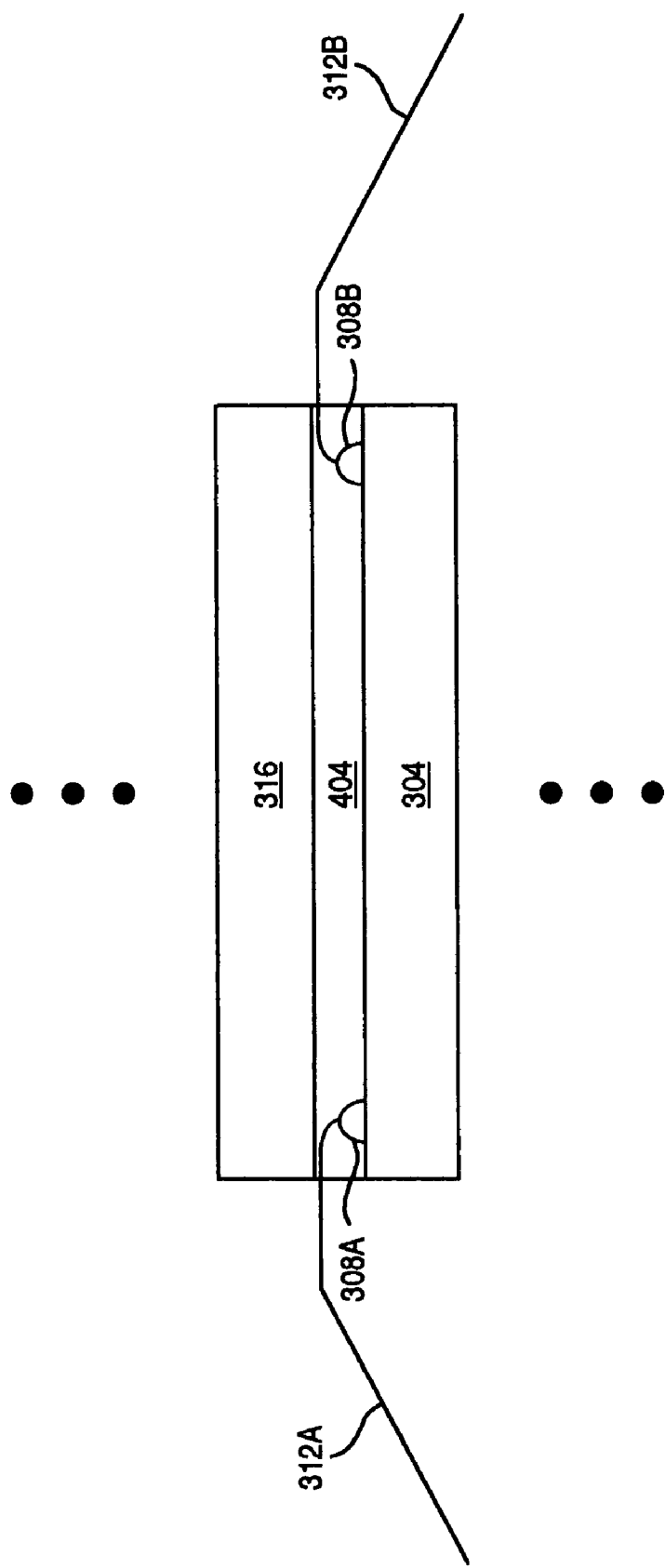
FIG. 4B is a cross sectional view of two dies closely secured by using an adhesive film and insulated bonding wires, according to one embodiment.

FIG. 4B is a cross sectional view of two dies closely secured by using an adhesive film 404 and insulated bonding wires, according to one embodiment. As illustrated in FIG. 4B, the adhesive film 404 (e.g., a silver-based epoxy paste, a silver-glass paste, a liquid solder, an organic adhesive, etc.) is used to secure the first die 304 and the second die 316. The adhesive film 404 may be formed on top of the first die 304 once the wirebonding on the first die 304 is completed. Unlike the film on wire layer 214 (e.g., not insulated) of FIG. 2, it is not necessary to leave a room to clear the second die 316 from the bonding wires in this embodiment with the adhesive film 404 because the bonding wires (e.g., the bonding wire 312A, the bonding wire 312B, etc.) are free from creating a short circuit between the second die 316 and the bonding wires.

Figure 5A:
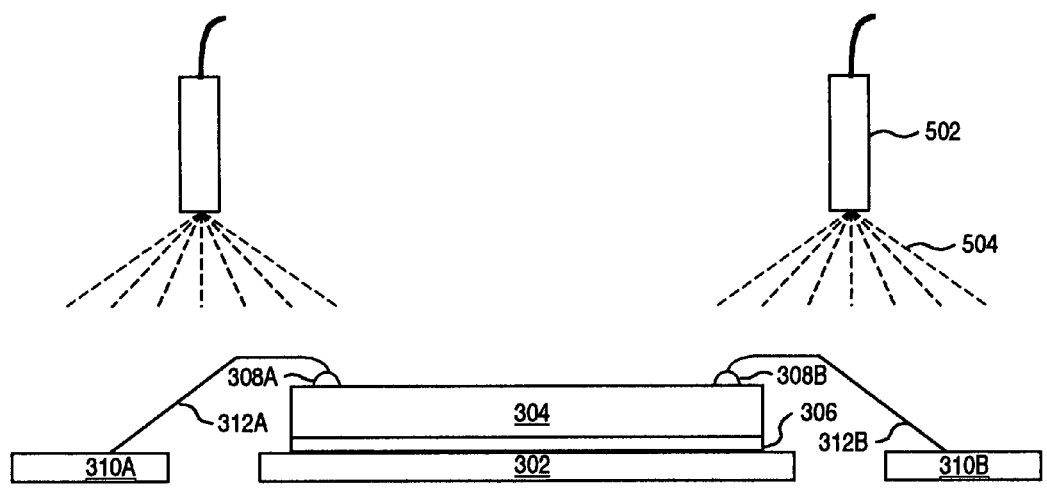
FIG. 5A is a schematic diagram of the bonding wires of FIG. 3 treated with an insulating material in liquid, according to one embodiment.

FIG. 5A is a schematic diagram of the bonding wires of FIG. 3 treated with an insulating material in liquid 504, according to one embodiment. As illustrated in FIG. 5, the bonding wires (e.g., the bonding wire 312A, the bonding wire 312B, etc.) are sprayed with the insulating material in liquid 504 by using a spray machine 502. In one example embodiment, the insulating material in liquid 504 may be a silicon dioxide or a polytetrafluoroethylene (e.g., Teflon). The spraying of the insulating material 504 may be directed close to the bonding wires to prevent it from damaging other components.

Figure 5B:
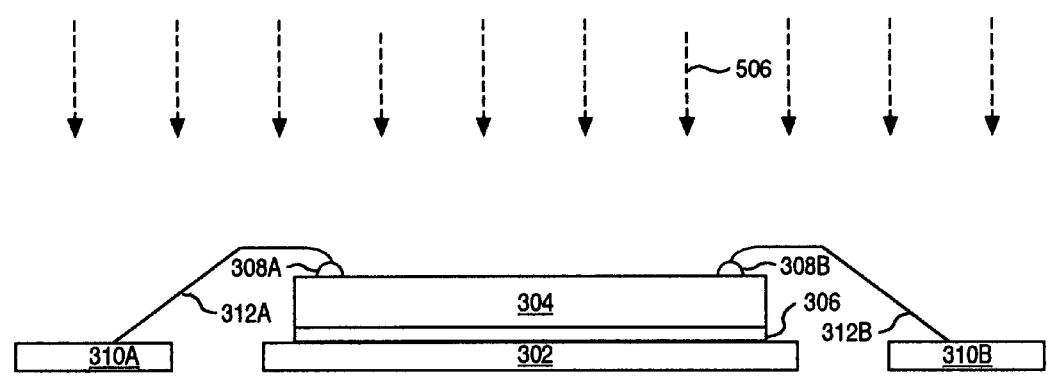
FIG. 5B is a schematic diagram of the bonding wires of FIG. 3 treated with an insulating material by a plasma-enhanced chemical vapor deposition (PECVD) process, according to one embodiment.

FIG. 5B is a schematic diagram of the bonding wires of FIG. 3 treated with an insulating material 506 by a plasma-enhanced chemical vapor deposition (PECVD) process, according to one embodiment. As illustrated in FIG. 5B, the bonding wires (e.g., the bonding wire 312A, the bonding wire 312B, etc.) may be treated with the insulating material 506 by exposing the bonding wires to a plasma-enhanced chemical vapor deposition (PECVD) process. The plasma enhanced chemical vapor deposition (PECVD) is used to deposit the insulating material 506 on the bonding wires by exposing the bonding wires to the insulating material 506 in a gas state (e.g., vapor). When the insulating material 506 in the gas state settles on the bonding wires, it transforms to a solid state (e.g., thus coating the bonding wires). Once the PECVD process is completed, it may be necessary to clean up the film of the insulating material 506 formed on other components beside the bonding wires.

Figure 6:
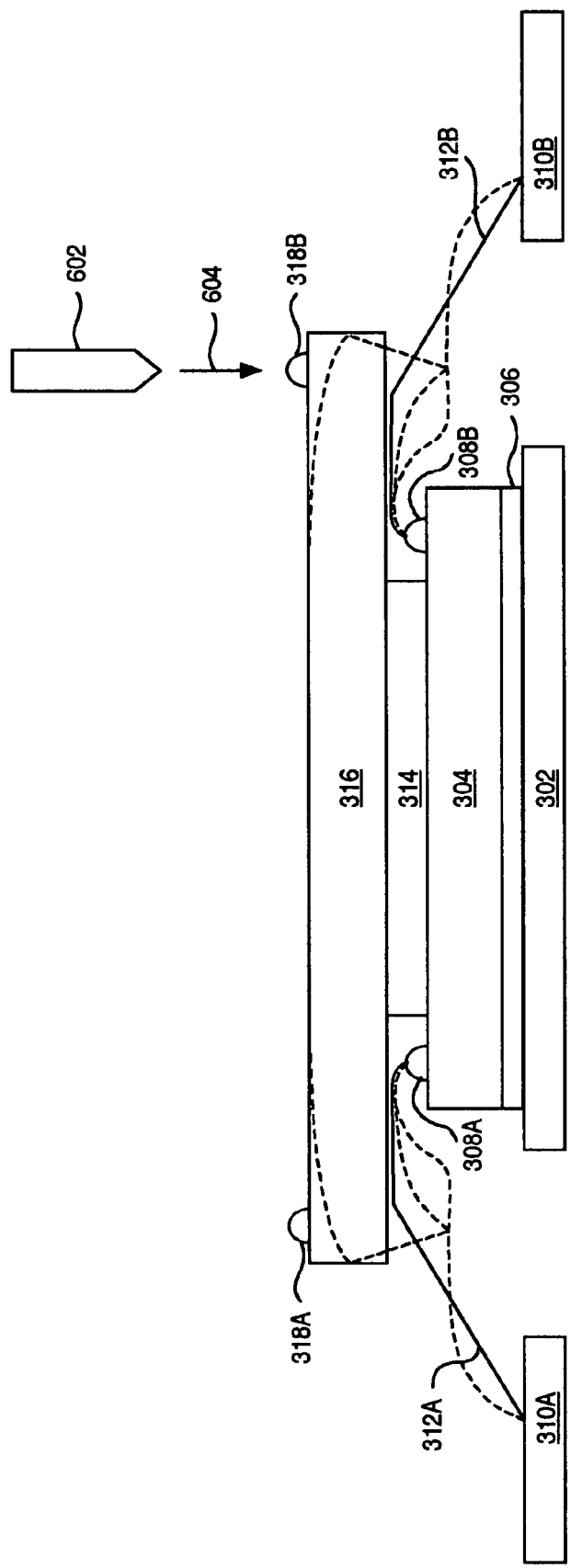
FIG. 6 is a schematic diagram of the bonding pads of the second die of FIG. 3 being welded by a capillary wire bonding machine, according to one embodiment.

FIG. 6 is a schematic diagram of the bonding pads of the second die 316 of FIG. 3 being welded by a capillary wire bonding machine 602, according to one embodiment. As illustrated in FIG. 6, a set of bonding wires may be welded to the top surface of the second die 316. In case the second die 316 is larger than the first die 304, the bonding wires (e.g., the bonding wire 312A, the bonding wire 312B, etc.) of the first die 304 may be used to support the second die 316 when the second die 316 is deflected during the welding process of the set of bonding wires for the second die 316. The availability of the bonding wires of the first die 304 as the support for the second die 316 during the welding process may allow one to design the second die 316 thinner than what is currently available.

Figure 7:
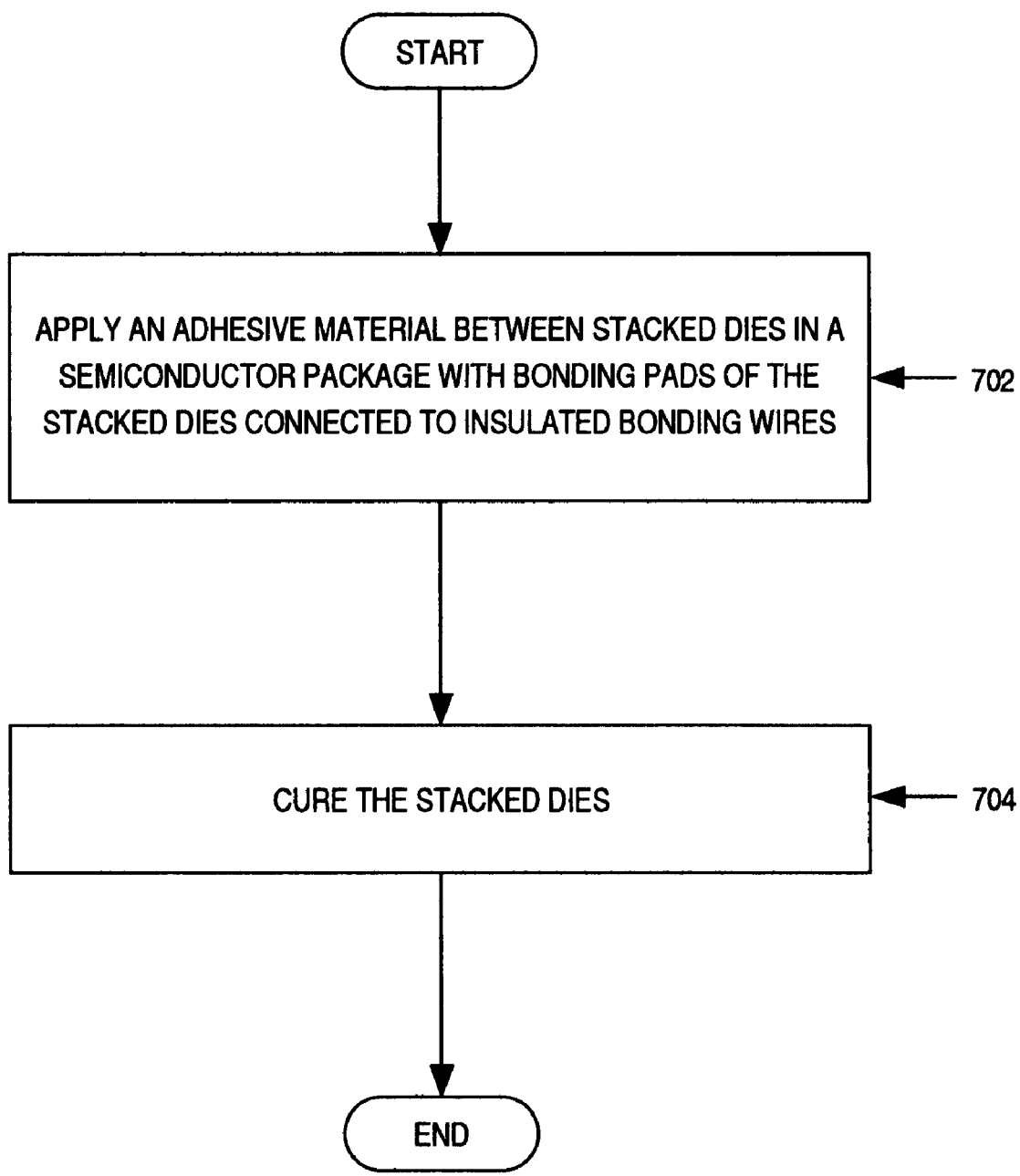
FIG. 7 is a process flow diagram of securing stacked dies with an adhesive material, according to one embodiment.

FIG. 7 is a process flow diagram of securing stacked dies with an adhesive material, according to one embodiment. In operation 702, an adhesive material is applied between adjacent ones of stacked dies (e.g., having bonding pads connected to insulated bonding wires) in a semiconductor package. In operation 704, the stacked dies are cured. In one example embodiment, the stacked dies may be baked for about one hour at 175 degrees Celsius to treat (e.g., dry) the adhesive material. In another example embodiment, the stacked dies, the bonding pad, and the bonding wires may be encapsulated with a protective shell.

Figure 8:
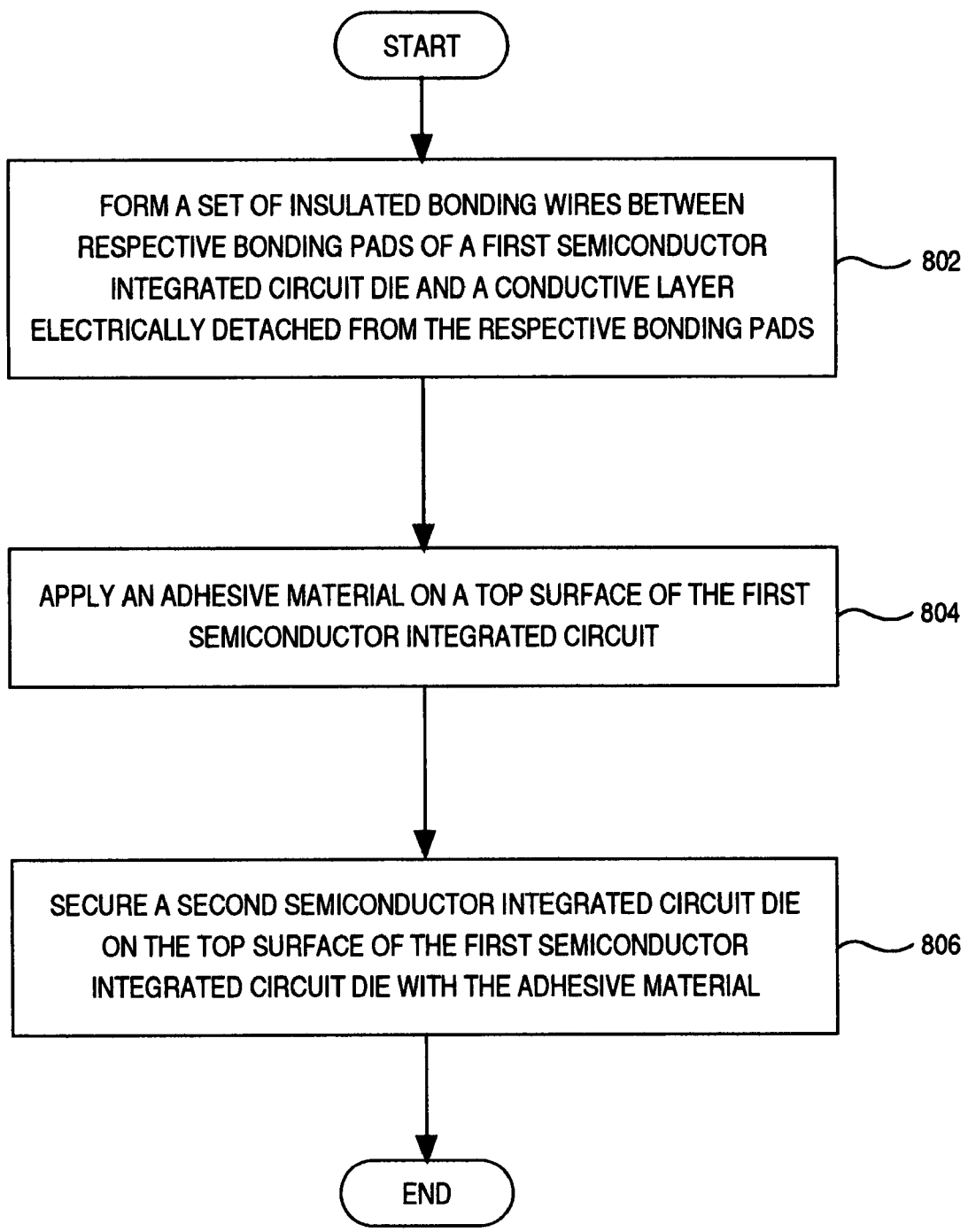
FIG. 8 is a process flow diagram of securing a second semiconductor integrated circuit die on a top surface of a first semiconductor integrated circuit die by using a set of bonding wires and an adhesive material, according to one embodiment.

FIG. 8 is a process flow diagram of securing a second semiconductor integrated circuit die on a top surface of a first semiconductor integrated circuit die by using a set of bonding wires and an adhesive material, according to one embodiment. In operation 802, a set of bonding wires are formed (e.g., connected) between respective bonding pads of a first semiconductor integrated circuit die and a conductive layer electrically detached from the respective bonding pads. In operation 804, an adhesive material is applied on a top surface of the first semiconductor integrated circuit. In operation 806, a second semiconductor integrated circuit die is secured on the top surface of the first semiconductor integrated circuit die with the adhesive material.

In one example embodiment, the respective bonding pads may be electrically connected to respective bonding fingers of the conductive layer with the set of bonding wires. In another example embodiment, the set of bonding wires may be coated with the insulating material by spraying the set of bonding wires in situ with the insulating material in liquid or by treating the set of bonding wires with the insulating material in situ through a plasma-enhanced chemical vapor deposition (PECVD) process. In yet another embodiment, the second semiconductor integrated circuit is supported by the set of bonding wires of the first semiconductor integrated circuit when another set of bonding wires are welded to bonding pads of the second semiconductor integrated circuit die.

In summary, embodiments described herein pertain to methods and structures that reduce the height in semiconductor package, and in particular, a reduction of gap between adjacent dies of the semiconductor package. By coating bonding wires of stacked dies of the semiconductor package with an insulating material and securing the stacked dies with an adhesive material, the embodiments enable the reduction of the size and production cost of the semiconductor package while increasing its throughput.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for fabricating stacked dies in a semiconductor package, comprising:
    applying an adhesive material between the stacked dies, wherein the stacked dies include bonding pads connected to bonding wires; and
    curing the stacked dies, wherein the bonding wires are coated with an insulating material and wherein the insulating material comprises silicon dioxide and polytetrafluoroethylene (PTFE).

2. The method of claim 1, wherein the bonding wires are connected to one of a leadframe and an interconnecting substrate.

3. The method of claim 1, wherein the stacked dies are mounted to one of a printed wiring board and an interconnecting substrate.

4. The method of claim 1, wherein the bonding wires are made of one of a copper, an aluminum, and a gold.

5. The method of claim 1, wherein the adhesive material comprises an epoxy paste.

6. The method of claim 1, wherein the adhesive material comprises a thin film made by one of a silver-based epoxy paste, a silver-glass paste, a liquid solder, and an organic adhesive.

7. The method of claim 1, wherein a gap between the stacked dies is about 50 micrometers.

8. The method of claim 1, wherein the curing the stacked dies further comprises baking the stacked dies for about 1 hour at 175 degrees Celsius.

9. The method of claim 8, further comprising encapsulating the stacked dies, the bonding pads, and the bonding wires with a protective shell.

10. A method for stacking dies of a semiconductor package, comprising:
    forming a set of insulated bonding wires between respective bonding pads of a first semiconductor integrated circuit die and a conductive layer electrically detached from the respective bonding pads;
    applying an adhesive material on a top surface of the first semiconductor integrated circuit die; and
    securing a second semiconductor integrated circuit die on the top surface of the first semiconductor integrated circuit die with the adhesive material wherein the second semiconductor integrated circuit die is in contact with the set of insulated bonding wires wherein the forming the set of bonding wires comprises spraying the set of bonding wires in situ with the insulating material in liquid and wherein the forming the set of bonding wires comprises treating the set of bonding wires with the insulating material in situ by a plasma-enhanced chemical vapor deposition (PECVD) process.

11. The method of claim 10, wherein the forming the set of bonding wires further comprises electrically connecting the respective bonding pads with respective bonding fingers of the conductive layer with the set of bonding wires.

12. The method of claim 10, wherein the set of bonding wires are coated with the insulating material prior to the forming the set of bonding wires.

13. The method of claim 10, wherein the second semiconductor integrated circuit die is supported by the set of bonding wires of the first semiconductor integrated circuit die when another set of bonding wires are welded to bonding pads of the second semiconductor integrated circuit die.

14. The method of claim 10, wherein the insulating material on the set of bonding wires prevents a formation of a short circuit between the second semiconductor integrated circuit die and the set of bonding wires.

15. A semiconductor package, comprising:
    a plurality of stacked semiconductor integrated circuit dies closely attached by an adhesive material;
    multiple sets of bonding wires connecting respective bonding pads of the plurality of stacked semiconductor integrated circuit dies to respective bonding fingers; and
    an encapsulant enclosing the plurality of stacked semiconductor integrated circuit dies, the multiple sets of bonding wires, the respective bonding pads, and the respective bonding fingers,
    wherein the multiple sets of bonding wires are coated with an insulating material and wherein a plurality of semiconductor integrated circuit dies are in contact with the multiple sets of bonding wires coated with an insulating material.

16. The semiconductor package of claim 15, further comprising a grid array substrate to mount the plurality of stacked semiconductor integrated circuit dies.

17. The semiconductor package of claim 15, further comprising a leadframe to mount the plurality of stacked semiconductor integrated circuit dies.

* * * * *